(12) United States Patent
Frayer

(10) Patent No.: US 6,754,103 B2
(45) Date of Patent: Jun. 22, 2004

(54) METHOD AND APPARATUS FOR PROGRAMMING AND TESTING A NON-VOLATILE MEMORY CELL FOR STORING MULTIBIT STATES

(75) Inventor: Jack E. Frayer, Boulder Creek, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/288,361

(22) Filed: Nov. 4, 2002

(65) Prior Publication Data

US 2004/0085812 A1 May 6, 2004

(51) Int. Cl.⁷ ............................................. G11C 16/00
(52) U.S. Cl. ......................... 365/185.03; 365/185.22; 365/185.23
(58) Field of Search ..................... 365/185.03, 185.22, 365/185.23

(56) References Cited

U.S. PATENT DOCUMENTS

| | | | |
|---|---|---|---|
| 5,029,130 A | 7/1991 | Yeh | 365/185.31 |
| 5,293,560 A | 3/1994 | Harari | 365/185.63 |
| 5,901,089 A | 5/1999 | Korsh et al. | 365/185.24 |
| 5,905,673 A | 5/1999 | Khan | 365/185.03 |
| 5,969,987 A | 10/1999 | Blyth et al. | 365/185.03 |
| 6,038,174 A * | 3/2000 | Khan et al. | 365/185.28 |
| 6,040,993 A * | 3/2000 | Chen et al. | 365/185.03 |
| 6,097,628 A * | 8/2000 | Rolandi | 365/185.03 |
| 6,614,683 B1 * | 9/2003 | Parker | 365/185.03 |

* cited by examiner

Primary Examiner—Tan T. Nguyen
(74) Attorney, Agent, or Firm—Gray Cary Ware & Freidenrich LLP (57) ABSTRACT

The present invention is a method and apparatus to program and/or to test a non-volatile memory cell to be programmed into a plurality of bit states (with each bit state having two states). More particularly, the method rapidly programs or tests such a cell by hard programming the cell when the cell is to be programmed into a state which permits the minimal amount of current to flow in the channel. The charge pump integral with the memory device is capable of generating two types of pulses: a small incremental pulse, and a "hard" pulse, which is used only if the cell is to be programmed into the fully programmed state. For the states between fully programmed and fully erased, the incremental pulse is used to incrementally program the cell.

12 Claims, 8 Drawing Sheets

|  | SF FG 4X | 2X FG A | 2X FG B | 2X FG C | 2X FG D | 2X FGE | 1 STEP OFF |
|---|---|---|---|---|---|---|---|
| VWL RD | 4 |  |  |  |  |  |  |
| VS COUPL | 0.92 |  |  |  |  |  |  |
| WL COUPL | 0.8 |  |  |  |  |  |  |
| UV CELL DURING RD | 1.72 |  | 1.8 | 2 | 2.2 | 2 |  |
| CELL FG Vt | 1.2 | 0 FG | 0 | 0 | 0 | 0 |  |
| DELTA FG TOTAL (RD) | 1.6 | 0.4 FG | 0.36 | 0.4 | 0.44 | 0.4 |  |
| DELTA VS PGM | 4.00 | 0.4 FG | 0.36 | 0.4 | 0.44 | 0.4 | 0.8 |
| ERASE FG DELTA FROM UV | 1.25 | 0.8 FG | 0.8 | 0.8 | 0.6 | 0.8 |  |
| ERASE FG DURING RD | 2.97 | 1.2 FG | 1.2 | 1.2 | 1.2 | 1.2 |  |
| 18 LEVEL USEABLE RANGE | 1.57 | 3.00 SRC | 3.00 | 3.00 | 3.00 | 3.00 |  |
| FG STEP REQUIRED 18 PULSES | 25 mV FG | 1.25 FG | 1.25 | 1.25 | 1.25 | 1.5 |  |
| VS PGM STEP REQUIRED | 61 mV SRC | 1.65 FG | 1.81 | 1.65 | 1.89 | 1.9 |  |
|  |  | 0.85 FG | 0.81 | 0.85 | 0.89 | 1.1 |  |
|  |  | 53 mV FG | 51 | 53 | 56 | 69 |  |
|  |  | 133 mV SRC | 127 | 133 | 139 | 172 |  |
|  |  |  |  |  |  | 1 |  |
|  |  | MARGIN mV | PULSES->1V | ID HIGH | ID LOW | VDS | UNCOXW/(2L) | VGS-VT | PULSES/LEVEL |
| 2X CELL CONDITION A |  |  |  |  |  |  |  |
| STATE 11 | 1.65 FG> | 1.489 | 161 |  | 17.0 | 11.2 | 23.5 | 0.689 | 3.02 |
| STATE 10 | 1.489>FG> | 1.348 | 142 | 3.0 | 11.2 | 7.1 | 23.5 | 0.548 | 2.67 |
| STATE 00 | 1.348>FG> | 1.178 | 170 | 5.7 | 7.1 | 3.4 | 23.5 | 0.378 | 3.20 |
| STATE 01 | <0.8V |  |  |  | 0 |  |  |  |
|  |  |  |  |  |  | VDS | UNCOXW/(2L) | VGS-VT | PULSES/LEVEL |
| 2X CELL CONDITION B |  |  |  |  |  |  |  |
| STATE 11 | 1.61 FG> | 1.411 | 199 |  | 15.4 | 8.8 | 23.5 | 0.611 | 3.94 |
| STATE 10 | 1.411>FG> | 1.295 | 116 | 3.9 | 8.8 | 5.8 | 23.5 | 0.495 | 2.29 |
| STATE 00 | 1.295>FG> | 1.16 | 135 | 6.2 | 5.8 | 3.0 | 23.5 | 0.360 | 2.87 |
| STATE 01 | <0.8V |  |  |  | 0.6 |  |  |  |
|  |  |  |  |  |  | VDS | UNCOXW/(2L) | VGS-VT | PULSES/LEVEL |
| 2X CELL CONDITION E |  |  |  |  |  |  |  |
| STATE 11 | 1.9 FG> | 1.69 | 208 |  | 17.0 | 11.2 | 14.0 | 0.892 | 3.02 |
| STATE 10 | 1.692>FG> | 1.51 | 183 | 3.0 | 11.2 | 7.1 | 14.0 | 0.709 | 2.67 | 9.5 | 0.88 |
| STATE 00 | 1.509>FG> | 1.29 | 220 | 5.7 | 7.1 | 3.4 | 14.0 | 0.459 | 3.20 | 5.8 | 0.42 |
| STATE 01 | <0.8V |  |  |  |  |  |  |  |  |  | 0.20 |

METHOD AND APPARATUS FOR PROGRAMMING AND TESTING A NON-VOLATILE MEMORY CELL FOR STORING MULTIBIT STATES

TECHNICAL FIELD

The present invention relates to a method for programming and for testing a select non-volatile memory cell of a memory array to store a plurality of multibit states (wherein a bit state has two states) with each state controlling a different amount of current flowing in a channel of the memory cell. More particularly, the present invention relates to a method and apparatus for programming and testing such a cell more rapidly than the method of the prior art.

BACKGROUND OF THE INVENTION

Non-volatile memory cells of the EEPROM type or flash variety are well known in the art. There are at least two general types of such non-volatile memory using a floating gate to store the charges thereon to control the flow of current in a channel beneath the floating gate. One type is the stack gate wherein a control gate lies on top of a floating gate and is mutually aligned with the edges of the floating gate. The stack gate can be used in a NAND-type configuration or a NOR-type configuration. The other type of floating gate non-volatile memory cell ("split gate") uses a control gate laterally spaced from the floating gate to control the flow of current in a different portion of the channel.

In both of these types of non-volatile memory cells, it is well known to use them to store a plurality of multibit states. Thus, a single cell can store a plurality of bits. In such event, the floating gate must store a varied amount of charges with the varied amount of charges controlling a varied amount of current in the channel.

Typically, to program a non-volatile memory cell of either the stack gate type or the split gate type, charges are first all removed or erased from the floating gate. Thereafter, charges are incrementally programmed and stored on the floating gate. In the prior art, as exemplified by U.S. Pat. No. 5,293,560; or U.S. Pat. No. 5,969,987; or U.S. Pat. No. 5,901,089; or U.S. Pat. No. 5,905,673, it is disclosed that a small pulse of current is used to program the cell, to place charges onto the floating gate. Thereafter, the state of the programming of the floating gate is determined by reading the cell and comparing it to the desired state. If there is insufficient charges on the floating gate, an incrementally increased second pulse of charge is introduced and is programmed onto the floating gate. The cell is then again read and compared to the desired state. This process continues until the desired amount of charges is stored on the floating gate. Further, this process of incrementally charging the floating gate with a small pulse is used even if the floating gate is to be fully charged to a state such that the minimal amount of current flows in the channel. This is because in the prior art, especially for the NAND configuration, it is undesirable to over-program the cell. When the cell is over-programmed, the programming of other non-volatile memory cells in the same string or chain of NAND cells can be interrupted and disabled. Thus, the prior art teaches incrementally programming each cell for programming and testing purposes even if the state to which the cell is programmed is to be the fully programmed state. Because the state of the cell is checked after each pulse of programming, the checking or the reading of the cell and comparing it to the desired state is time consuming.

SUMMARY OF THE INVENTION

Accordingly, in the present invention, a method of programming or testing a select non-volatile memory cell is disclosed. A pulse generator circuit is integrated with the memory array and the memory cell has a floating gate for storing charges therein to control the flow of current in a channel. The method of programming or testing the select memory cell to one of a plurality of bit states with each state controlling a different amount of current flowing in the channel with a first state of the select memory controlling the least amount of current flowing in the channel, comprises receiving a plurality of binary signals followed by converting the plurality of binary signals into a select state of the plurality of bit states for the select memory cell. A first pulse type is generated by the pulse generator and applied in the event the select state is the first state. The select memory cell is read. The first pulse type is reapplied to the memory cell in the event that the select memory cell is not programmed to the select state. Alternatively, a second pulse type is generated by the pulse generator and is applied in the event the select state is other than the first state. The second pulse type is smaller than the first pulse type. The memory cell is then read. The second pulse type is reapplied to the select memory cell in the event the select memory cell is not programmed to the select state.

The present invention also comprises an integrated non-volatile memory cell device having an array of non-volatile memory cells and with a pulse generator circuit integrated with the array. The pulse generator circuit is capable of generating a first pulse type and a second pulse type with a second pulse type smaller than the first pulse type. The programming circuit programs a select non-volatile memory cell from the memory array to a select state where the programming circuit causes the pulse generator circuit to generate the first pulse type in the event the select state is the first state and causes the pulse generator circuit to generate the second pulse type in the event the select state is other than the first state.

DETAILED DESCRIPTION OF DRAWINGS

Figure 6:
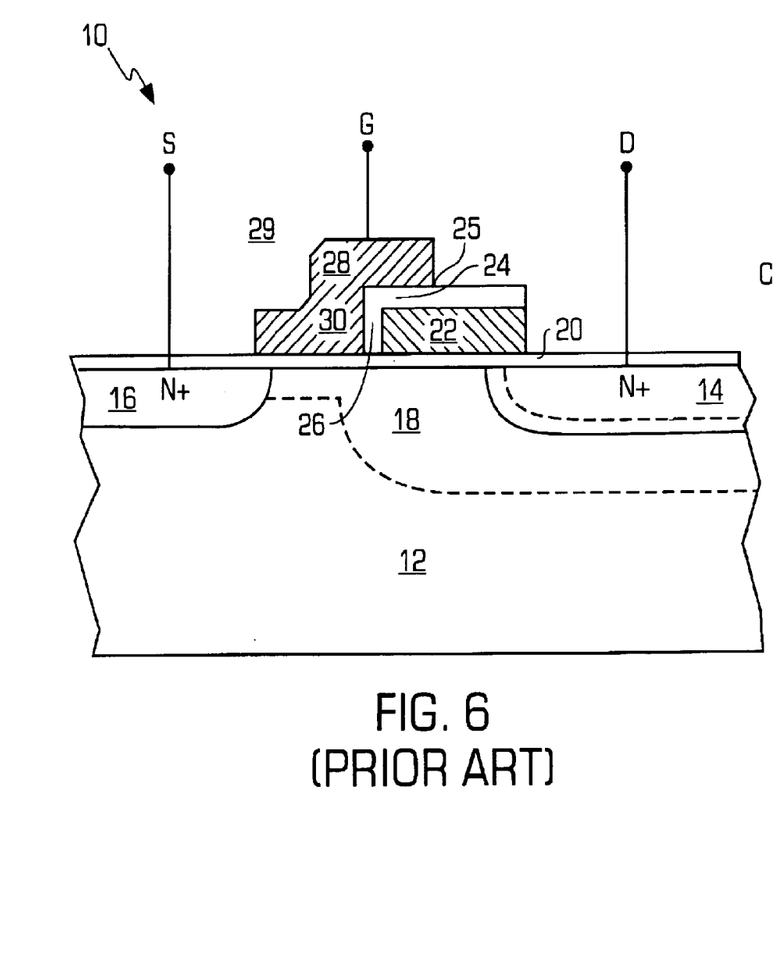
FIG. 6 is a cross-sectional side view of one embodiment of a non-volatile memory cell to which the method of the present invention can be used.

Referring to FIG. 6, there is shown a cross-sectional view of a non-volatile memory cell 10 of the prior art, as disclosed in U.S. Pat. No. 5,029,130, whose disclosure is incorporated herein in its entirety by reference. The cell 10 may be used in the method and circuit of the present invention. Although this cell 10 may be used, it should be noted that the method of the present invention may be practiced with any non-volatile memory cell such as a split gate type or a stack gate type where over programming is not an issue. Typically a split gate cell, such as that disclosed in U.S. Pat No. 5,029,130, has a source region 16, a spaced apart drain region 14, in a substrate 12 with a channel 18 therebetween. Of course, the notation of a "source" or a "drain" may be reversed. A floating gate 22 is over a portion of the channel 18 and is insulated therefrom by the first insulating layer 20, typically of silicon dioxide. A control gate 29 has two portions: a first portion 30, disposed over another portion of the channel 18 and is insulated therefrom, and is immediately adjacent to and insulated from the floating gate 22, and a second portion 28, which is over a portion of the floating gate 22 and is insulated therefrom. The control gate controls the flow of current in the "another" portion of the channel 18.

Figure 5:
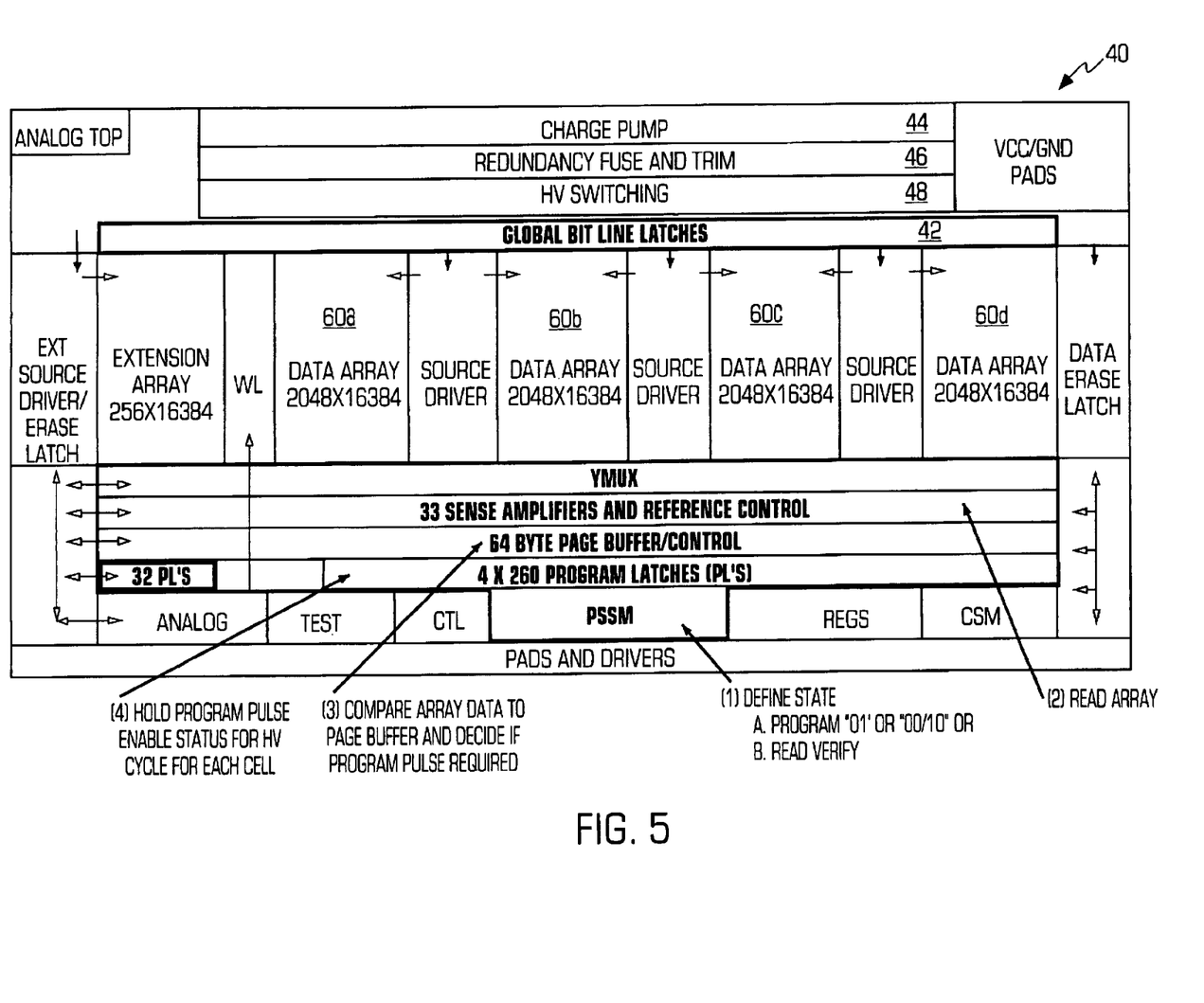
FIG. 5 is a plan view of a memory cell array device of the present invention.

The cell 10 can be fabricated into an array 40 shown in FIG. 5. Specifically, the array 40 comprises a plurality of subarrays 60(a–d) of memory cells 10. In addition, the array 40 has global bitline latches 42, charge pump 44, redundancy fuse and trim circuit 46 and high voltage switching circuit 48. Except for the high voltage generator 44, all of the circuits shown in the array 40 are of well known design.

Figure 7:
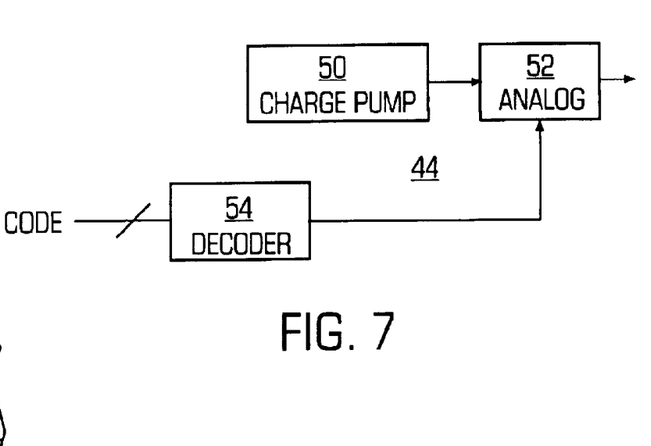
FIG. 7 is a schematic view of the pulse generator circuit used in the memory cell array device of the present invention.

Referring to FIG. 7, there is shown a schematic block level diagram of the high voltage generator 44 used in the memory array 40 of the present invention. The high voltage generator comprises an analog block 52 which receives high voltage from charge pump 50 and a decoder 54. The decoder circuit 54 activates discrete voltage levels to be generated by the analog block 52. In the present invention, if the decoding circuit 54 detects the state to which a particular memory cell 10 is to be programmed to is "01", then the decoder 54 causes the analog circuit to be set to the maximum programming voltage and supplied to appropriate cells 10 in the array 40. For the states of "10", and "00", the decoder circuit 54 causes the analog circuit 52 to generate a pattern of increasing small high voltage steps. The state of "11" represents the erased state, in which event no high voltage is passed to cell 10 in the array 40 or an inhibit condition is setup in array 40 so that the cell 10 does not program. The output of the high voltage generator 44 is supplied to the various portions of the array 40 as shown as disclosed in U.S. Pat. No. 5,029,130.

When the particular code pattern is "01" and the high voltage generator 44 is activated, the output of the analog 52 is a first pulse type. The state of "01" represents the state of the floating gate such that the least amount of current flows in the channel 18. When the decoder 54 decodes the code as "11", which represents the erased state, then the maximum amount of current is permitted to flow in the channel 18. In that event, the high voltage generated in 44 is not passed to individual cells 10 or the cell 10 is placed into a mode preventing programming. When the code patter is "10" or "00", the high voltage generator 44 outputs a second pulse type. The first pulse type from the high voltage generator 44 is larger in amplitude than the second pulse type from the high voltage generator 44. In the preferred embodiment, the first pulse type is 2 usec in duration and is approximately a fixed 8V in the amplitude of the voltage with the second pulse type being 2 usec in duration with a starting voltage of 5V in amplitude of the voltage.

Figure 1:
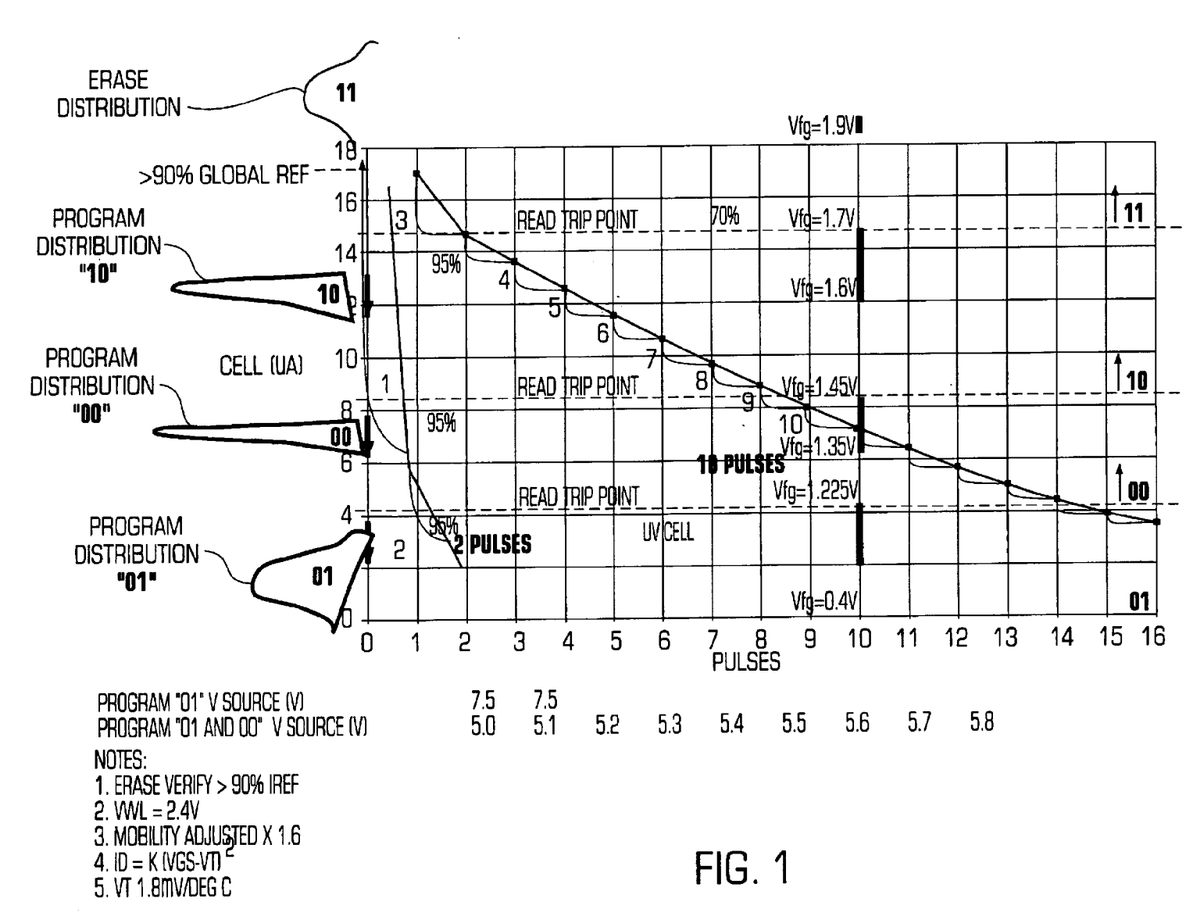
FIG. 1 is a graph showing the method of the present invention for programming a memory cell to one of four states.

Referring to FIG. 1, there is shown a graph of the application of the first and second type pulses from the high voltage generator 44, respectively, in accordance with the method of the present invention. As well known, in a flash device, when a cell is to be programmed, it must first be erased. The erased state is designated as the "11" state. If it is desired to program the particular cell 10 to a state of "01", which is the state in which the minimal amount of current flows in the channel region 18, then the decoder 54 would detect this condition and activate the analog circuit 52 to generate the first pulse type. The high voltage generator 44 would generate the first pulse type which is of a "larger" size than the second pulse type and applied to the selected memory cell 10 as disclosed in U.S. Pat. No. 5,029,130. The programmed state of the selected memory cell 10 is then read and compared to a preprogrammed reference cell to determine if the selected memory cell 10 is programmed to the "10" state. If it is, then the programming method stops. If it is not, then the high voltage generator 44 is activated to generate another first pulse type which is applied to the selected memory cell 10. In the event the result of applying the first pulse type a second time causes the selected memory cell 10 to be programmed to the state of "01", then the programming is terminated. However, in the event the selected cell 10 is not programmed to the state of "01", although it is possible to apply a third first pulse type again, in accordance with the present method, it is preferred that the cell 10 be declared a defective cell and replaced by one of the spare cells. The use of a first pulse type is typically a "hard" pulse.

Figure 2:
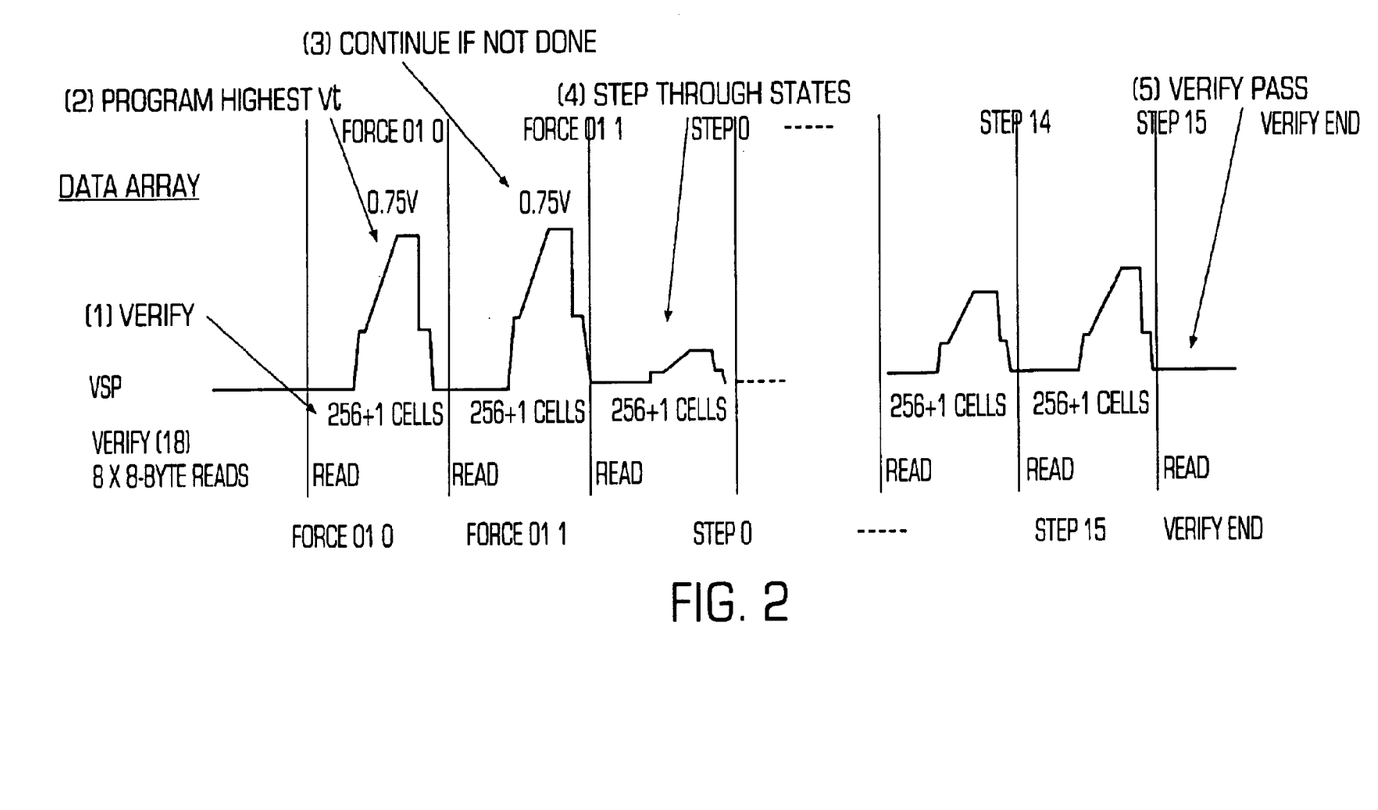
FIG. 2 is a chart of pulses showing the method of the present invention used for programming a memory cell to a plurality of bit states in a memory array.

Further, in accordance with the method of the present invention, in the event the selected cell 10 is to be programmed to a state of "10", or "00", then the decoder 54 causes the analog circuit 52 to generate the second pulse type. As previously described, each second pulse type is of a lower amplitude than the first pulse type. After each second pulse is applied to the selected cell 10, the decoder 54 increments the starting second pulse amplitude for the subsequent second pulse type. The cell 10 is read and the state of the selected cell 10 is determined. Thus, in the event it is desired to program the selected cell 10 to the state of "10", a second second pulse type is applied and the selected cell 10 is read. The state of the selected cell 10 is compared and if it is in the state "10", then programming is terminated or inhibited for the cell 10. If not, a third second pulse type is applied. The selected cell 10 is again read and the state of the selected cell 10 is compared. This continues until the selected cell 10 has reached the desired state. This is shown in FIG. 2.

In the method of the present invention, the state of "10" represents the fully programmed state in which the minimal amount of current can flow in the channel 18. The state which causes the next least amount of current to flow in the channel is the "00" state. The state which causes yet the next least amount of current to flow in the channel is the "10" state. Finally, the state which causes the most amount of current flow in the channel, or the erased state, is the "11" state. The choice of progression of the states from ""11" (maximum amount of current flow in the channel) to "10" to "00" to "01" (minimal amount of current flow in the channel), is significant in that the change from one state to the immediate next state for the least amount of change in the regulation of the amount of current flow necessitates only one bit to change its state. Thus, for example, from the state of "11" to the state of "10", only one bit change occurs. Similarly from the state of "10" to the state of "00", only one bit change occurs. Finally, from the state of "00" to "01" only one bit change occurs. With only one bit change per change in state, a reduction in the amount of error correction code can be achieved.

The advantage of the method of the present invention is that compared to the method of the prior art, the programming method of the present invention is faster than the method of the prior art. In the prior art, if it is desired to program a selected cell 10 to a state other than "01" which is the state by which the least amount of current flows in the channel 18 between the source 16 and drain 14, the method of the present invention performs exactly like the method of the prior art. In particular, upwards of ten or more pulses may be used to program a selected cell 10 to the states of "00". However, unlike the method of the prior art wherein when the selected cell 10 is desired to be programmed to the state of "01" in which the least amount of current flows in the channel 18 between source 16 and drain 14, the present invention requires two steps at most of programming and reading verification. This results in a faster programming method.

Figure 3:
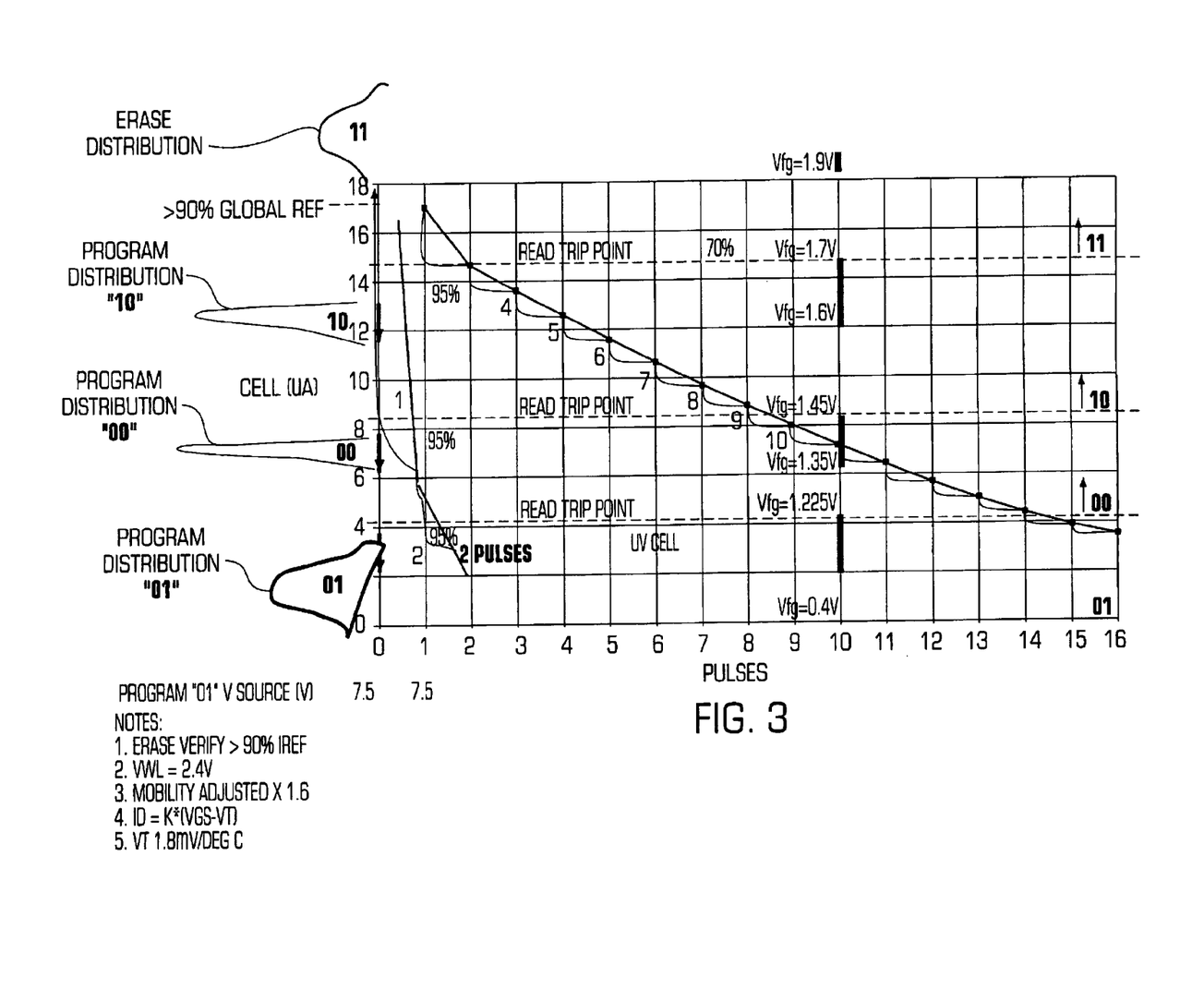
FIG. 3 is a graph showing the method of the present invention for testing a memory cell to one of four states.

The method of the present invention may also be used to test a select memory cell 10. Referring to FIG. 3 there is shown a graph similar to the graph shown in FIG. 1. When the selected memory cell 10 is desired to be tested for the state of "01", it is programmed to that state. In that event, a first pulse type from the high voltage generator 44 is used to place a charge on the floating gate. The selected memory cell 10 is then read and compared to a reference cell to determine if it is programmed to the state "01". If it is, then the selected cell is deemed to be capable of being programmed to the state of "01". If it is not, then another first pulse type is applied. The selected memory cell 10 is read again and compared to a reference cell. If the selected memory cell is determined not to be in the state of "01", then the selected cell 10 is deemed to be a failure, and a spare cell is then substituted for that cell, in the subarray 60(a), (b), (c) or (d). The selected memory cell 10 is also tested for its ability to be programmed into the states of "11", "10" and "00" This testing is done by the second pulse type from the high voltage generator 44 being applied to the selected memory cell 10. After each pulse of the second pulse is applied, the selected memory cell 10 is read, and is then compared to a particular reference cell, storing the state (e.g. "11", "10" "00") to which the selected memory cell 10 is to be tested against. If the result of testing shows that the selected memory cell 10 is not at the desired level state, another second pulse type is applied. The selected memory cell 10 is then read again and compared to the particular reference cell. This process continues until all the states of "11", "10" and "00" have been tested. If the selected memory cell 10 can be programmed into those states, then the selected memory cell 10 is deemed to be functional. Otherwise, a replacement cell is substituted in the particular subarray 60(a–d) in which the selected memory cell 10 is found.

Figure 4:
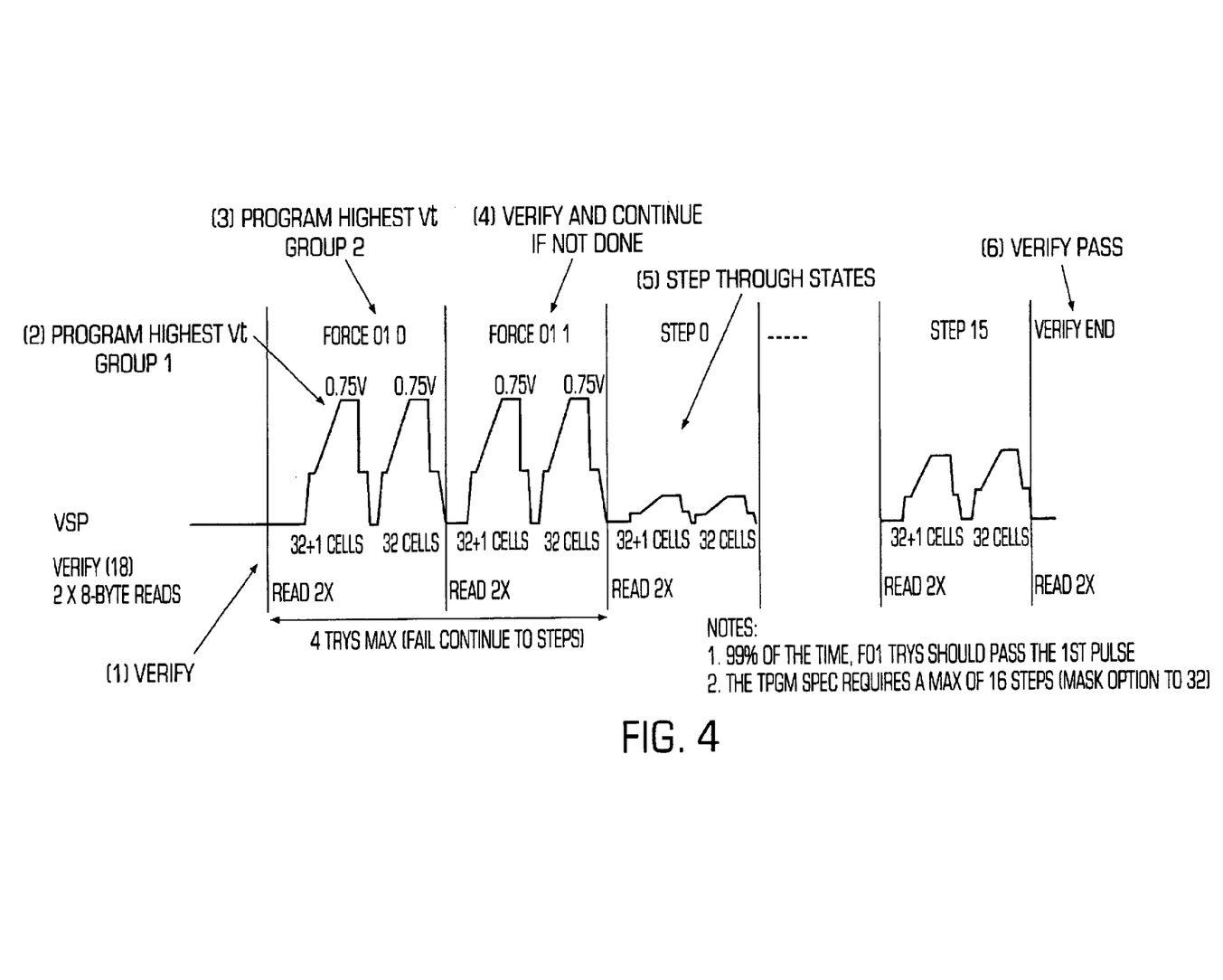
FIG. 4 is a chart of pulses showing another embodiment of the present invention used for time multiplexed programming of a memory cell to one of a plurality of bit states in a memory array.

Referring to FIG. 4 there is an alternative embodiment of the method of the present invention. In this alternative embodiment, termed "time multiplexed programming" the foregoing described method of programming is applied to the programming of a plurality of select memory cells. For example, assume that two select memory cells 10 are desired to be programmed to the "01" state. One of the select memory cells 10 is in the memory subarray 60(a), with the other select memory cell 10 in the memory subarray 60(b). Because each of the subarrays 60(a), 60(b) can be independently operated, e.g. read, the method of the present invention can proceed as follows. A memory cell 10 of the memory subarray 60(a) is selected, and a first pulse type is applied. If the high voltage generator 44 is able to deliver a first pulse type simultaneously to the select memory cell 10 in the memory subarray 60(a) and the select memory cell 10 in the memory subarray 60(b), then the first pulse type is also applied to the select memory cell 10 in the subarray 60(b). If the high voltage generator 44 is unable to deliver a first pulse type simultaneously to both subarrays 60(a) and 60(b), then the first pulse type is applied to the subarray 60(b) after the first pulse type is applied to the select memory cell 10 in the subarray 60(a). The select memory cells 10 from the subarrays 60(a) and 60(b) are read simultaneously. If they are both programmed to the state "01," then the method terminates. However, if one or both cells is not programmed to the "01" state, then another first pulse type is applied to the select memory cell(s) which is not programmed to the state of "01."

Similarly, for programming of the select memory cells 10 in the subarrays 60(a) and 60(b), to states of "10" and "00, the method of time multiplexing, described heretofore may be use.

Figure 8:
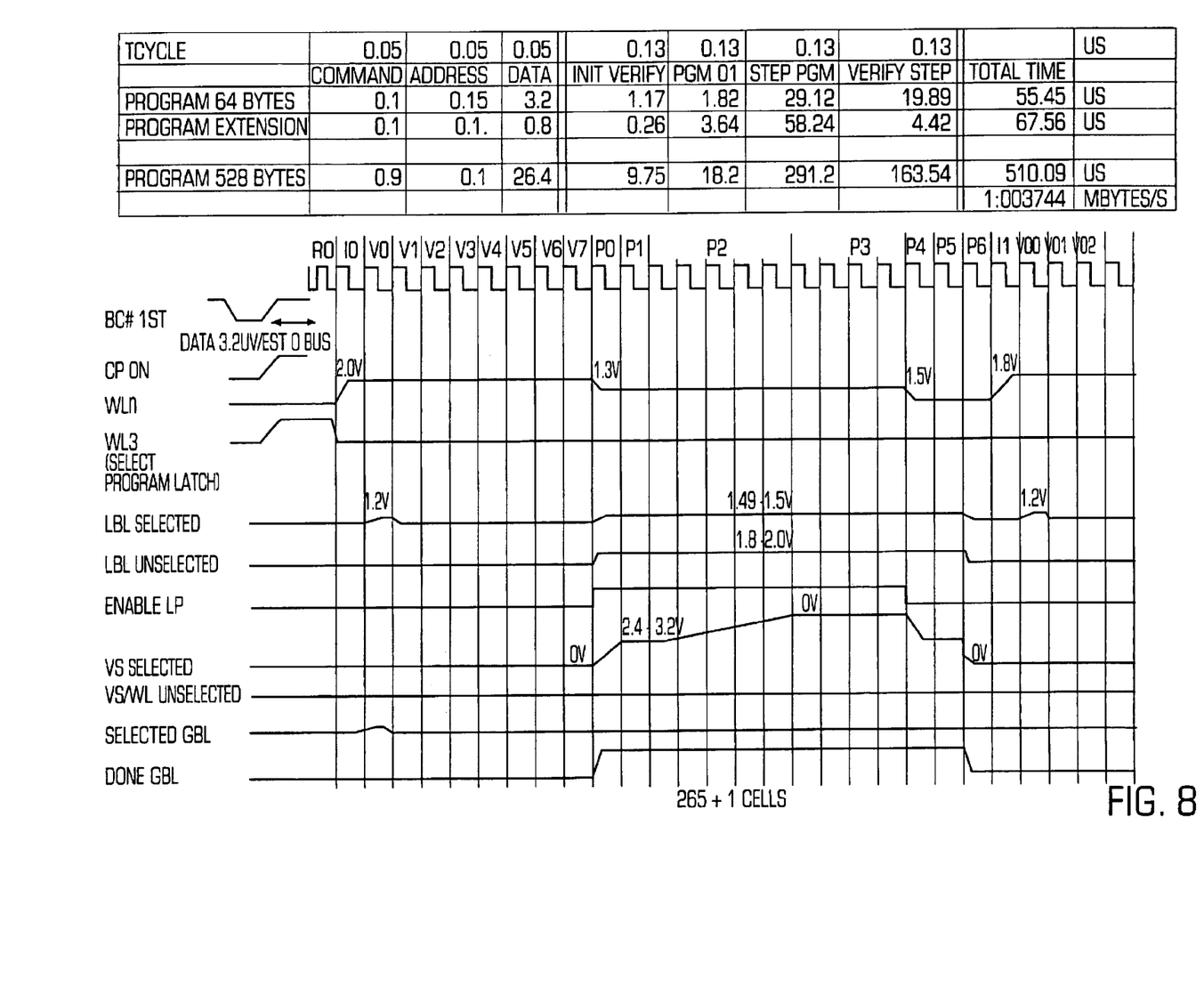
FIG. 8 is a timing reference diagram for programming in accordance with the method of the present invention.

Referring to FIG. 8 there is shown a timing diagram for the programming method of the present invention. The program timing is comprised of repeated cycles of one or more read verifies followed by a controlled high voltage pulse. As the program operation proceeds, the magnitude of the high voltage pulse adjusts according to the first pulse type or the second pulse type. The total program time is calculated by multiplying this basic time period by the number of pulses required to successfully program the cells 10.

Figure 9:
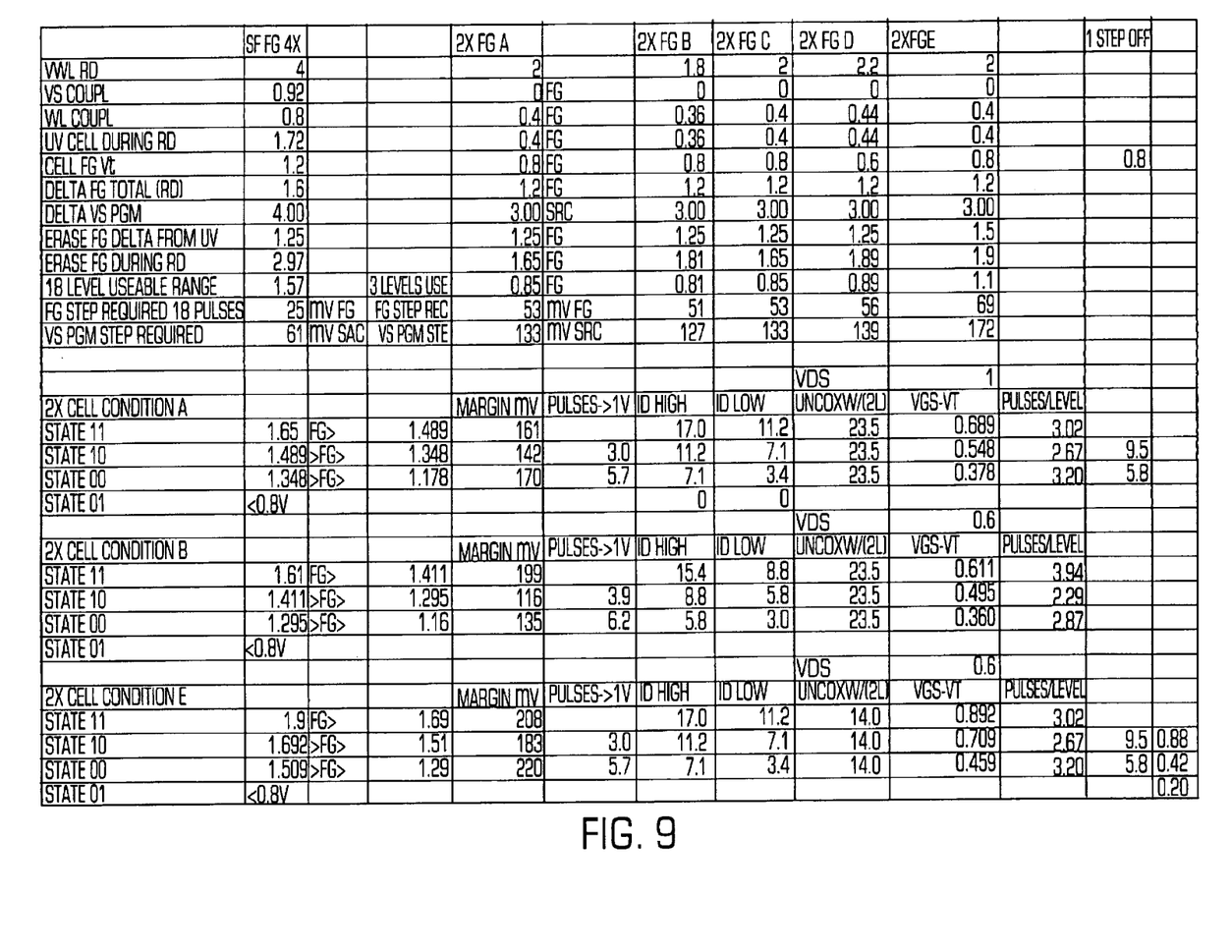
FIG. 9 is an example of a reference cell condition chart for the method of the present invention.

Referring to FIG. 9 there is shown an example of a Reference cell condition. Condition "A" shows an example of dividing the states "11", "10", "00" and "01" into both voltage ranges or current ranges. An estimate for the number of high voltage pulses to pass through each state is indicated. By programming reference cells to the borders of the indicated ranges, read verification for the array 40 can be achieved.

What is claimed is:

1. A method of programming a select non-volatile memory cell of a memory array having a pulse generator circuit integrated with said memory array, said select memory cell having a floating gate for storing charges therein to control the flow of current in a channel, said method for programming said select memory cell to one of a plurality (more than two) of states with each state controlling a different amount of current flowing in said channel with a first state of said select memory cell controlling the least amount of current flowing in said channel, said method comprising:

receiving a plurality of binary signals;

converting said plurality of binary signals into a select state of said plurality of states for said select memory cell;

generating a first pulse by said pulse generator and applying said first pulse in the event said select state is said first state;

reading said select memory cell; and reapplying said first pulse to said select memory cell in the event said select memory cell is not programmed to said select state; or generating a second pulse by said pulse generator and applying said second pulse in the event said select state is other than said first state, with said second pulse smaller than said first pulse;

reading said select memory cell; and reapplying said second pulse to said select memory cell in the event said select memory cell is not programmed to said select state.

2. The method of claim 1 wherein the number of states is four.

3. The method of claim 1 further comprising the step of erasing a plurality of memory cells including said select memory cell, prior to programming said select memory cell.

4. The method of claim 1 wherein said first state corresponds to said binary signals being "01".

5. The method of claim 4 wherein a second state of said plurality of states for controlling the least amount of current flowing in said channel, other than said first state, corresponds to said binary signals being "00".

6. The method of claim 5 wherein a third state of said plurality of states for controlling the least amount of current flowing in said channel, other than said first and second states, corresponds to said binary signals being "10".

7. The method of claim 6 wherein a fourth state of said plurality of states for controlling the least amount of current flowing un said channel other than said first, second and third states, corresponds to said binary signals being "11".

8. A method of programming a plurality of select non-volatile memory cells of a memory array having a pulse generator circuit integrated with said memory array, said memory array comprising a first group of memory cells and a second group of memory cells, with one of said plurality of select non volatile memory cells in said first group and another of said plurality of select non volatile memory cells in said second group, with each memory cell of said memory array having a floating gate for storing charges therein to control the flow of current in a channel, said method for programming each of said plurality of select non-volatile memory cells to one of a plurality (more than two) of states with each state controlling a different amount of current flowing in said channel with a first state of each of said plurality of select memory cells controlling the least amount of current flowing in said channel, said method comprising:

receiving a plurality of groups of binary signals for storing each group in a different one of said plurality of select non-volatile memory cells;

converting each of said groups of binary signals into a select state for each of said plurality of select non-volatile memory cell;

generating a first pulse by said pulse generator and applying said first pulse to one of said plurality of select non volatile memory cells in the event said select state is said first state;

generating a first pulse by said pulse generator and applying said first pulse to another of said plurality of select non volatile memory cells in the event said select state is said first state;

reading said one select memory cell and said another select memory cell, substantially simultaneously; and reapplying said first pulse to said one select memory cell in the event said one select memory cell is not programmed to said select state; or to said another select memory cell in the event said another select memory cell is not programmed to said select state; or generating a second pulse by said pulse generator and applying said second pulse to said one select memory cell in the event said select state is other than said first state, with said second pulse smaller than said first pulse;

generating a second pulse by said pulse generator and applying said second pulse to said another select memory cell in the event said select state is other than said first state, with said second pulse smaller than said first pulse;

reading said one select memory cell and said another select memory cell substantially simultaneously; and reapplying said second pulse to said one select memory cell in the event said one select memory cell is not programmed to said select state; or to said another select memory cell in the event said another select memory cell is not programmed to said select state.

9. A method of testing a select non-volatile memory cell of a memory array having a pulse generator circuit integrated with said memory array, said select memory cell having a floating gate for storing charges therein to control the flow of current in a channel, said method for testing said select memory cell to determine its ability to store one of a plurality (more than two) of states with each state controlling a different amount of current flowing in said channel with a first state of said select memory cell controlling the least amount of current flowing in said channel, said method comprising:

a) generating a first pulse by said pulse generator and applying said first pulse to said select non-volatile memory cell to determine its ability to store said first state;

b) reading said select memory cell;

c) reapplying said first pulse to said select memory cell in the event said select memory cell read is not in said first state;

d) reading again said select memory cell;

e) rejecting said memory cell as being defective in the event said memory cell read again is not in said first state;

f) generating a second pulse by said pulse generator and applying said second pulse to determine the ability of said select non-volatile memory cell to store a second state other than said first state, with said second pulse smaller than said first pulse;

g) reading said select memory cell;

h) reapplying said second pulse to said select memory cell in the event said select memory cell is not in said second state;

i) reading again said select memory cell; and j) repeating said steps of h) and i)

k) rejecting said memory cell as being defective in the event said memory cell read again is not in said second stated.

10. The method of claim 9 further comprising the steps of repeating said steps of h) and i) to determine the ability of said memory cell to store a selected state other than said first or second states.

11. An integrated non-volatile memory cell device comprising:

an array of non-volatile memory cells each having a floating gate for storing charges therein to control the flow of current in a channel, wherein said floating gate being capable of being programmed to one of a plurality (more than two) of states with each state controlling a different amount of current flowing in said channel with a first state of a memory cell controlling the least amount of current flowing in its corresponding channel;

a pulse generator circuit integrated with said array, said circuit for generating a first pulse and a second pulse, with said second pulse smaller than said first pulse; and a programming circuit for programming a select non-volatile memory cell from said array to a select state, wherein said programming circuit for causing said pulse generator circuit to generate said first pulse in the event said select state is said first state, and for causing said pulse generator circuit to generate said second pulse in the event said select state is other than said first state.

12. The device of claim 11 wherein each non-volatile memory cell is of the split gate type having a floating gate for controlling the flow of current in a first portion of the channel and a control gate for controlling the flow of current in a second portion of the channel.

* * * * *